April 5, 1966 P. R. LATIMER 3,244,795

STACKED, LAMINATED PRINTED CIRCUIT ASSEMBLIES

Filed May 31, 1963

INVENTOR.
PAUL R. LATIMER
BY Mandeville & Schweitzer
ATTORNEYS

United States Patent Office 3,244,795

Patented Apr. 5, 1966

3,244,795

STACKED, LAMINATED PRINTED CIRCUIT ASSEMBLIES

Paul R. Latimer, Charlotte, N.C., assignor to Riegel Paper Corporation, New York, N.Y., a corporation of Delaware Filed May 31, 1963, Ser. No. 284,609
3 Claims. (Cl. 174—68.5)

Figure 1:
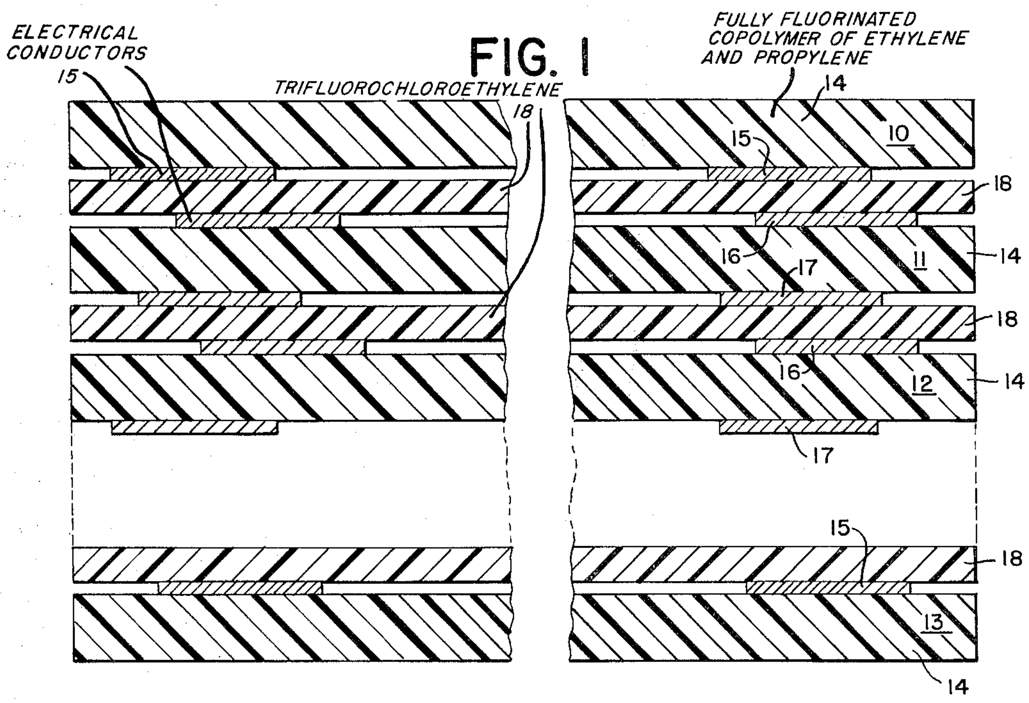

The present invention relates to laminated printed circuit assemblies, and is directed more specifically to a novel and improved method and apparatus involving the assembly of a plurality of printed circuit laminations in stacked or superposed relation and the bonding of the individual printed circuit laminations in such stacked relation, whereby a plurality of individual circuits are retained in predetermined relationship, in a highly compact, multiple-circuit assembly.

So-called printed circuit systems are finding increasing use in electrical and electronic apparatuses, particularly with the increasing availability of the flexible, thermoplastic film-based printed circuit assemblies, which may be inexpensively manufactured and easily installed in a minimum of space. The utilization of such printed circuit arrangements has been accelerated recently, particularly in view of developments in the production lamination of copper foil conductors to desired fluorocarbon (e.g. Teflon) base films on a continuous basis, as described in the copending application of John J. Garrett Serial No. 240,771, filed November 27, 1962.

One of the potentially attractive applications of printed circuit techniques resides in the "stacking" of a plurality of circuits in superposed, laminated relation. In an integrated, compact circuit "stack" desirable electronic effects may be achieved (such as, introduction or avoidance of capacitance) and convenient arrangements may be made for making terminal connections simultaneously with a plurality of printed circuit conductors at different levels in the stack with a single connector pin, for example. With the availability of such base film material as Teflon, which is extremely strong and exceptionally stable at a given film thickness, the theoretical attractiveness of stacked printed circuits has been greatly increased. However, prior to the making of the present invention it has proved extremely difficult, and in many cases impossible, to manufacture on any commercially practical basis a stacked, laminated printed circuit assembly utilizing Teflon or similar base film materials.

In the manufacture of printed circuit materials, utilizing Teflon or similar thermoplastic film base materials, it is conventional to laminate a conductive copper foil to the base film material and thereafter to etch away the conductive foil in the undesired areas, leaving the foil in a predetermined, conductive pattern, still bonded to the base film. As will be understood, the remaining portions of the conductive foil have very little inherent strength, and are non-self-supporting apart from the base film material. Thus, in preparing stacked, laminated circuit assemblies, it is necessary to proceed in such a way that the assembly is completed without substantially affecting the original thermoplastic bond between the etched conductor patterns and their supporting films.

In accordance with the invention, a stacked, laminated printed circuit assembly is constructed by superposing in a novel way a plurality of printed circuit units, each typically including an etched circuit pattern and a conductor-supporting thermoplastic film bonded thereto. The conductor-supporting film advantageously is of a stable, chemically resistant, heat-bondable material, the fluorinated hydrocarbons such as Teflon and Kel-F being particularly suitable for the purpose in view of their relatively high melting points which enable them to resist exposure to high temperature circuit applications. Between each of the conductor supporting films is interleaved a thermoplastic bonding film, which carries no printed circuit pattern and serves only to bond together, and if necessary also to insulate, superposed, adjacent layers of conductor supporting film. In accordance with the invention, the bonding film is specifically selected to have a melting point less than that of the conductor-supporting film, although still high enough to enable the completed assembly to withstand exposure to elevated temperatures. The bonding film has a thickness at least slightly in excess of the total thickness of the conductor or conductors positioned between adjacent, superposed layers of conductor-supporting film, enabling the bonding film to be reformed under heat and pressure to bond to the exposed surface areas of adjacent conductor-supporting films and to embrace and insulate the conductive circuit patterns.

One of the significant advantages realized through the present invention is that a large plurality of film-supported printed circuit units may be permanently laminated in stacked relationship, with all of the printed circuit conductors of the finished stack being aligned in a precise, predetermined, mutual relationship. Thus, in the completed assembly, the disposition of selected conductor portions in different levels of the stack may be utilized to achieve a desired electronic effect, such as the introduction of or the elimination of capacitance, minimization of hum, etc. In addition, precise, predetermined vertical alignment of conductor portions in different levels of the stack is possible, which permits simultaneous connection to be made to conductors in several levels of the completed stack, through suitable conductor pins, for example.

Figure 2:
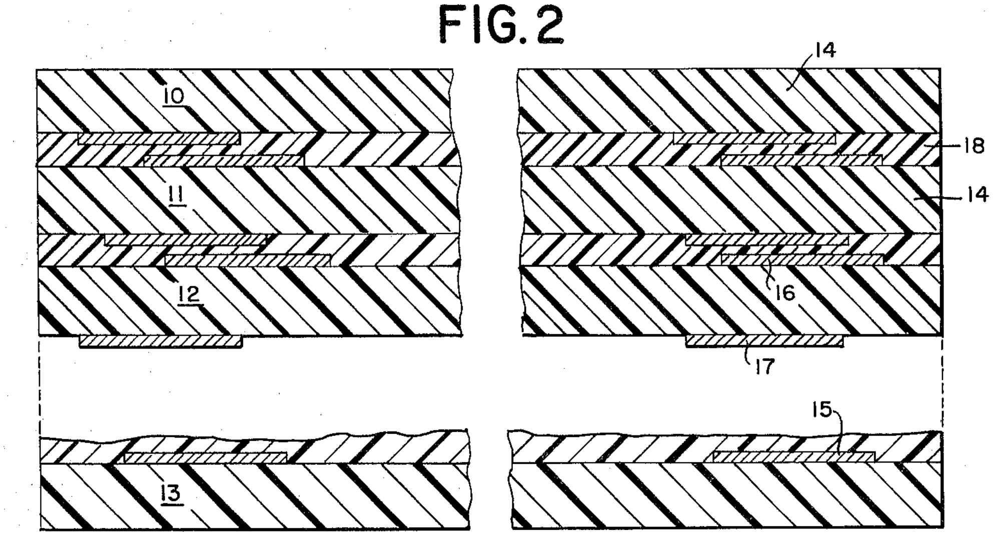

For a better understanding of the invention, reference should be made to the following detailed description and to the accompanying drawing, in which:

FIG. 1 is an enlarged transverse cross-sectional representation illustrating the method of manufacture of a stacked, laminated printed circuit assembly according to the invention; and FIG. 2 is an enlarged cross-sectional view illustrating a completed printed circuit stack according to the invention.

Referring now to the drawing, and initially to FIG. 1, the reference numerals 10–13 represent individual printed circuit units, which may be of any reasonable number according to the desired end use of the completed circuit assembly. Each of the printed circuit units comprises a conductor-supporting plastic film 14 and foil-like conductor elements bonded to one or both surfaces of the supporting film. Thus, in the case of the uppermost and lowermost circuit units 10 and 13 in the FIG. 1 illustration, conductor elements 15 are bonded only to the lower and upper surfaces, respectively. The internal circuit units 11, 12 of the FIG. 1 illustration each include two circuit elements 16, 17 bonded to both the upper and lower surfaces. It will be understood, however, that this is purely exemplary, as any circuit unit in the assembly may have conductor elements on either or both principal surfaces.

Advantageously, the printed circuit units 10–13 are manufactured in accordance with the procedures of the copending application of John J. Garrett, Serial No. 240,771, filed November 27, 1962. To this end, the conductor-supporting film material, which may have a thickness of about 10 mils (0.010 inch), may be formed of a fluorinated hydrocarbon thermoplastic material having advantageous properties of resistance to degradation by heat, but nevertheless being bondable to the foil-like conductor elements and to other plastic films under the influence of heat and pressure. Most advantageously, the conductor-supporting films 14 are formed of a fully fluorinated, non-symmetrical fluorocarbon plastic available from E. I. du Pont de Nemours & Company, Inc., under that company's designation "Teflon FEP Type C," which is a so-called "cementable" Teflon made regularly available by du Pont since July 22, 1961. The conductor-supporting film may also be a partially fluorinated hydrocarbon, such as the trifluorochloroethylene film manufactured by Minnesota Mining and Manufacturing Company under the trademark "Kel-F." The foregoing are only exemplary of particularly advantageous materials, however, because other materials may be employed within the purview of the invention.

As set forth in greater detail in the above-mentioned copending application of John J. Garrett, the printed circuit units initially are formed as continuous, heat-bonded laminations of the conductor-supporting films 14 to a single conductive foil 15 or to a pair of conductive foils 16, 17. Typically, the conductive foil, which may have a thickness of about 2 mils, extends over the entire surface of the conductor-supporting film. Subsequently, the film-foil starting material is processed by printing a "resist" material in a desired pattern on the exposed surface of the foil and then introducing the lamination into an etch bath to remove the uprinted areas of the conductive foil. The remaining areas of the conductive foil form a desired circuit pattern, including conductor portions and intermediate areas of exposed surface of the conductor-supporting film.

In a circuit assembly according to the invention, a predetermined plurality of printed circuit units, such as indicated at 10–13, are designed to provide mutually cooperative circuit patterns whereby, in the completed, laminated stack assembly, circuits at one level in the stack have a predetermined cooperation with circuits of other levels of the stack. One particularly advantageous aspect of the mutual relationship of the respective circuits is the ability of the designer to minimize hum and capacitance effects, for example, by arranging the conductors in different levels of the stack to follow special, predetermined paths. In this respect, a circuit stack consisting of as many as twelve distinct circuit levels, for example, may have a total thickness of less than $\frac{1}{10}$ of an inch, so that the circuit conductors of a large number of circuits may be brought into extremely close proximity for desired electronic effects.

Since one of the important aspects of the film-supported printed circuit assemblies of the invention is the abiliy of the completed assembly to withstand high temperature environments, it would appear desirable to utilize the conductor-supporting film itself, or film of the same composition, to insulate and bond together the printed circuit conductors of different levels in the stack. However, in assembling a plurality of printed circuit conductor units in the desired, predetermined alignment, as indicated in FIG. 1, for example, the various conductor elements inevitably will be so arranged as to result in the imposition of lateral pressures on the non-self-supporting conductor elements when laminating pressure is applied to the assembled stack. Such being the case, if the assembled stack is required to be heated to a temperature at which the conductor-supporting film itself will be heat bondable, the bond between the conductive elements and their respective supporting films will temporarily be softened, and this will inevitably result in a lateral shifting of the conductor elements within the stack. When the laminating operation is completed, the conductors at various levels will be noticeably re-arranged, so that the desired mutual relationship of the circuit levels no longer exists and the laminated circuit stack will not be useful for its intended purpose.

Thus, in accordance with the invention, separate thermoplastic bonding films, of material dissimilar to the conductor-supporting films, are inserted between each adjacent, superposed pair of conductor-supporting films, whether or not an insulating function is to be performed by the bonding film. Thus, as shown in FIG. 1, bonding films 18 are inserted between each of the printed circuit units 10–11, 11–12, etc., and, while in the specific illustration of FIGS. 1 and 2, the bonding films 18 serve to separate and therefore insulate opposed, facing layers of conductor elements, it is to be specifically understood that, within the specific teachings of the invention, a bonding film 18 would be utilized between adjacent, superposed conductor-supporting films 14 even if only one circuit pattern were disposed between the conductor-supporting films, and, for that matter, even if there were no conductor at all present between the two conductor-supporting films. In other words, in accordance with the invention, while the bonding film 18 does perform a definite insulating function where insulation is required, it is in all instances employed as an agent to bond one conductor-supporting film to an adjacent conductor-supporting film in the assembled stack.

In accordance with the invention, the composition of the thermoplastic bonding film 18 is such as to be compatible with that of the conductor-supporting films 14, while having a melting point sufficiently less than that of the conductor-supporting films to enable adjacent conductor-supporting films to be bonded together through the medium of the bonding film without themselves becoming melted or significantly softened. In this respect, however, melting point, per se, is not the critical characteristic; the essential characteristic of the bonding film 18 is that it soften and reform under heat, to embrace the exposed conductor elements, and that it become bonded to the adjacent conductor-supporting films, all at a temperature level below that at which the conductor-supporting films soften and reform, or at which the laminated bond between the conductor-supporting films and their supported conductors becomes temporarily or otherwise loosened to permit the conductors to shift laterally under pressure.

Most advantageously, when employing the above-described Teflon FEP Type C as a material for the conductor-supporting films, the bonding films are formed of a trifluorochloroethylene material such as Kel-F. The Teflon conductor-supporting film has a melting temperature in the range of 545–563° F., while the Kel-F bonding film material has a melting point on the order of 400° F. Thus, the assembled stack of FIG. 1 may be brought to a temperature slightly above 400° F., at which the Kel-F bonding material will become softened and reformed under laminating pressure and will become heat-bonded to the still intact Teflon conductor-supporting film 14 to form an integrated, laminated conductor stack, in which all of the printed circuit conductor elements are precisely in a predetermined mutual orientation.

As will be understood, other materials, compatible with Teflon FEP Type C, yet having a somewhat higher melting point than Kel-F, may be utilized in the bonding films 18, when said materials become commercially and competitively available. However, the melting point of the bonding film should not be so close to the melting point of the conductor-supporting film that it becomes difficult, as a matter of practical, commercial production, to reform and heat-bond the bonding film without softening or otherwise affecting the bond between the conductor-supporting films and their respective supported conductors.

It will be further understood, of course, that the specific film compositions mentioned above are considered to be exemplary of the most advantageous forms of the invention presently known. However, the principles of the invention are applicable to other materials. By way of specific example, it may be desirable in certain instances to utilize Kel-F film as the conductor-supporting film, in which case a thermoplastic material, compatible with Kel-F but having a melting point somewhat lower than 400° F., is utilized for the bonding film. Specifically, it would be suitable in such a case to employ the trifluorochloroethylene material manufactured by Allied Chemical Company under the trademark "Aclar." This material is similar to and compatible with Kel-F but has a somewhat lower melting point of about 350° F., which is sufficiently below that of the Kel-F film to enable the desired reformation and bonding of the Aclar film to take place without disturbing the bond of the printed circuit to its supporting film.

In accordance with another and more specific aspect of the invention, the bonding film utilized in a typical commercial production operation will have a thickness slightly in excess of two times the thickness of the foil-like conductor circuits carried by the films 14. Thus, as indicated in FIG. 2, after the lamination under heat and pressure has been completed, the bonding film is reformed to completely embrace the exposed conductor elements and to contact and be bonded with all exposed surface areas of the conductor-supporting film 14. In those instances where there are two, facing conductor elements between adjacent, superposed conductor-supporting films, the thickness of the bonding film is sufficient to provide for at least a thin layer of insulation between conductors at any point where one circuit crosses or lies directly above the other. Thus, in a typical production assembly, in which the conductor-supporting film has a thickness of about 10 mils and the foil-like conductors have a thickness of about 2 mils, the bonding film 18 advantageously has an initial thickness of about 5 mils. Thus, after heat reformation and bonding of the film 18, there remains at least about one mil of insulation between adjacent, facing conductors of superposed circuit units. It would be possible, of course, to selectively utilize first bonding films of slightly greater than two foil conductor thicknesses, where there are two conductors between adjacent supporting films, second bonding films of slightly more than one conductor foil thickness, to achieve proper bonding where only one conductor is present between adjacent supporting films, and a third type of bonding film of extremely thin construction, suitable for bonding to conductor-supporting films having no conductor present between them. However, as a practical commercial production procedure, it may be more advantageous to utilize a single type of bonding film, whose thickness is slightly greater than two conductor foil thicknesses, to simplify the assembly procedures.

The invention makes it possible for the first time to provide film-supported printed circuit units for high temperature application in a highly compact, laminated, stacked assembly. The advantageous result is realized by providing, between adjacent, superposed layers of conductor-supporting film, layers of compatible but lower melting point bonding films, which, under applied heat and pressure, reform and thermoplastically bond to the conductor-supporting films to form the desired, laminated stack without loosening or otherwise deleteriously affecting the bond between the printed circuit conductors and their supporting films. The arrangement is such that the plurality of printed circuit units, including supporting films mounting one or more foil-like conductors, may be assembled in predetermined, precise mutual orientation, with bonding films interleaved between each level of conductor-supporting film, and heat and pressure may be applied to perform a laminating operation while the conductor-supporting films are held in precise alignment. Since the bond between the conductors and their respective supporting films is not altered by reformation of the bonding film, the operation is completed while retaining the precise predisposition of the respective printed circuit conductors. Thus, for example, the laminated, stacked assembly, in its completed form, may serve, in addition to other ways, to provide a connection socket for a multi-pin vacuum tube, for example, enabling tube connections to be made at any of the various levels in the circuit stack.

In addition, and perhaps more important, the various conductor elements may be so disposed and arranged with the completed stack as to achieve desired electronic effects. Moreover, the predisposed conductor elements are permanently and substantially unalterably fixed in position, that the desired electronic effect is maintained throughout the operating life of the equipment.

It should be understood that the specific form of the invention herein illustrated and described is intended to be representative only, as certain changes may be made therein without departing from the clear teachings of the disclosure. Accordingly, reference should be made to the following appended claims in determining the full scope of the invention.

I claim:

1. A stacked, laminated printed circuit assembly comprising
   (a) at least two conductor supporting dielectric films of thermoplastic material arranged in spaced superposed relation, said supporting films having a predetermined melting temperature,
   (b) non-self supporting foil-like conductor means adhered to said conductor supporting films and forming a predetermined exposed conductor pattern upon surface areas of the films,
   (c) at least one of said foil-like conductor means being interposed between said spaced superposed conductor supporting films, and
   (d) a heat reformed bonding dielectric film of another thermoplastic material interposed between said spaced conductor supporting films,
   (e) said bonding dielectric film having a melting temperature lower than said first predetermined temperature of said conductor supporting films to accommodate heat reformation and heat-seal bonding of the bonding film directly to the exposed conductor means and to the surface areas of the conductor supporting films without distortion of the supporting films and without affecting the adherence of the conductor means thereto,
   (f) the heat-reformed bonding film embracing said at least one conductor means and being in direct heat-seal bonded contact with said at least one conductor means and with exposed surface areas of said conductor supporting films,
   (g) whereby said at least one conductor means is completely enveloped and electrically insulated by the cooperation of said bonding film and the supporting film to which said conductor is adhered.

2. A stacked, laminated printed circuit assembly in accordance with claim 1, in which
   (a) said supporting films are comprised of a fully fluorinated copolymer of ethylene and propylene, and
   (b) said bonding film is comprised of trifluorochloroethylene.

3. A stacked, laminated printed circuit assembly in accordance with claim 1, in which
   (a) said supporting films are comprised of trifluorochloroethylene having a melting point of approximately 400° F., and
   (b) said bonding film is comprised of trifluorochloroethylene having a melting point of approximately 350° F.

References Cited by the Examiner

UNITED STATES PATENTS

| | | | |
|---|---|---|---|
| 2,932,599 | 4/1960 | Dahlgren. | |
| 2,997,521 | 8/1961 | Dahlgren | 174—117 X |
| 3,053,929 | 9/1962 | Friedman | 174—68.5 |
| 3,057,952 | 10/1962 | Gordon | 174—68.5 X |

JOHN F. BURNS, *Primary Examiner.*

JOHN P. WILDMAN, E. JAMES SAX, *Examiners.*